Figure 1:
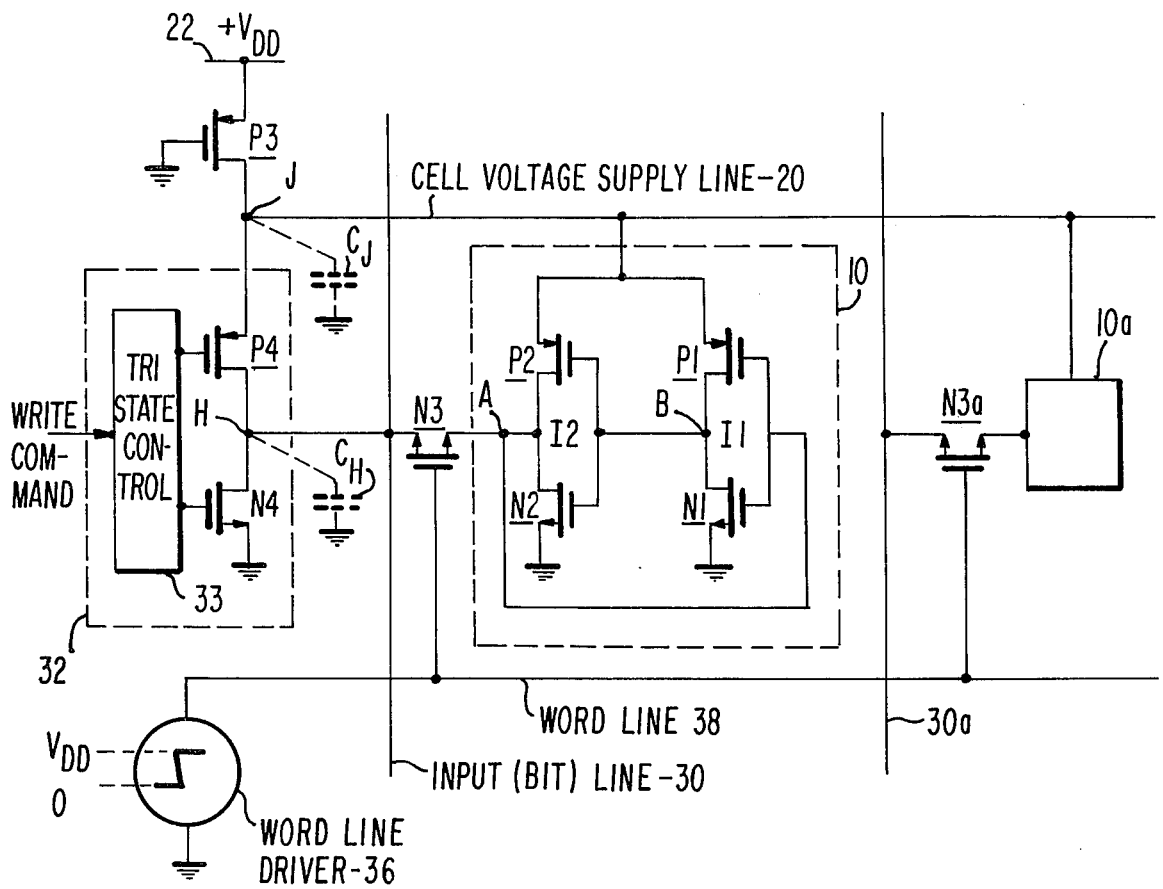

United States Patent

Oberman et al.

[11] 4,075,690
[45] Feb. 21, 1978

[54] WRITE ENHANCEMENT CIRCUIT

[75] Inventors: Joel Roy Oberman, Somerville; Roger Green Stewart, Neshanic Station, both of N.J.

[73] Assignee: RCA Corporation, New York, N.Y.

[21] Appl. No.: 667,101

[22] Filed: Mar. 15, 1976

[51] Int. Cl.² .......................................... G11C 11/40
[52] U.S. Cl. ................................. 365/156; 307/279; 307/238; 365/190
[58] Field of Search ................. 340/173 FF; 307/291, 307/279, 238

[56] References Cited

U.S. PATENT DOCUMENTS

| | | | |
|---|---|---|---|
| 3,389,383 | 6/1968 | Burke et al. | 340/173 FF |
| 3,609,710 | 9/1971 | Browne | 340/173 FF |
| 3,971,004 | 7/1976 | Dingwall | 340/173 FF |

OTHER PUBLICATIONS

Cavaliere et al., Writable Array-Logic Cell, IBM Technical Disclosure Bulletin, vol. 17, No. 7, 12/74, pp. 1967-1968.

*Primary Examiner*—Stuart N. Hecker
*Attorney, Agent, or Firm*—H. Christoffersen; H. I. Schanzer

[57] ABSTRACT

The operating potential to a storage element is supplied via an impedance element connected between a source of operating potential and a first power terminal of the storage element adapted to receive an operating potential. Information is written into the storage element via a gating transistor having its conduction path connected between an input line and a data input point to the storage element. Write circuitry includes means connected between the first power terminal and the input line. During a write operation, the write circuit, while applying the desired bit of information to the cell input, causes current to flow through the impedance element lowering the potential across the flip-flop until the desired bit of information is written into the cell.

17 Claims, 2 Drawing Figures

WRITE ENHANCEMENT CIRCUIT

This invention relates to memory cells, and, in particular, to means enabling information to be easily written into memory cells.

In the design of large memory arrays, a critical parameter is the largest number of memory cells that can be put on a chip, i.e., the packing density. In order to achieve a high packing density, the number of devices per memory cell must be small and the number of lines to access the cells must be as few as possible.

A known static memory cell which satisfies these general requirements includes 5 transistors per cell. Four of the five transistors are connected to form a flip-flop. The fifth transistor, referred to herein as the "gating" transistor, functions as a transmission gate. It is connected between a single input-output (I/O) point to the flip-flop and an I/O line and is used either to sense the state of the cell or to write information into the cell. Although the cell has many advantages there are some problems associated with it.

Where a single gating transistor is used to couple information from the data I/O line to the I/O point of the flip-flop there exists one binary signal condition on the I/O line for which the gating transistor operates in the (source or emitter) follower mode. In this mode, there is a voltage offset ($V_T$ or $V_{BE}$) between the control electrode (gate or base) of the transistor and one end of its conduction path (source or emitter) and this same offset appears across the conduction path of the transistor. As a result, during the write mode, the potential corresponding to the one binary condition is not fully applied to the flip-flop making it difficult to write that condition. For example, assume that the gating transistor is an insulated-gate field-effect transistor (IGFET) of N conductivity type. When a high signal of $V_{DD}$ amplitude, is present on the I/O line and a like high signal is also applied to the gate electrode of the gating transistor, the value of the signal coupled from the drain (I/O line) to the source (I/O point of flip-flop) of the transistor is offset by at least the value of the threshold voltage, $V_T$, of the transistor. That is, the maximum value of potential coupled to the flip-flop is $V_{DD}-V_T$. When $V_{DD}$ is at the lower portion of its 2.5 volt to 15 volt range and $V_T$ is one or two volts, it is evident that the offset voltage across the gating transistor may prevent the flip-flop from being set to the condition corresponding to the high input signal condition.

The write problem is further aggravated by the requirements that the read out of the memory cell be non-destructive and that the size of the cell be made as small as possible. To achieve these requirements the impedance of the conduction path of the gating transistor can not be made very small. Furthermore, in order to reduce read access time and prevent the cell contents from being inadvertently altered during the read cycle or during periods of time when the addresses are being changed, the output impedance of the inverter connected to the common I/O point may be deliberately made relatively low. This makes the cell relatively stable but difficult to write into because of the loading effect of the low impedance at the I/O point.

Various techniques are known in the art to overcome the writing difficulty. One of these methods proposes that the operating potential applied to the cell be decreased until the transverse of the cell are turned off; for then applying to the cell the desired bit of information to be written; and for then increasing the operating potential.

Another method teaches the reduction of the cell supply voltage to a value sufficiently high to enable the cell to remain in a static mode during the write operation. But, at the reduced level, the gating transistor is able to supply (or sink) enough current to permit the cell to change state.

In both of the above-cited methods, cells whose states are difficult to change at full operating voltage have their operating voltages reduced at the start of a write period and increased at the completion of the write operation. Normal system operation is not achieved in either of these schemes until full cell voltage is restored. These schemes require extra circuitry and timing arrangements for lowering the operating voltage before write and then restoring full voltage as soon as possible after the desired information has been written into the cell. They also dissipate power during a prolonged write condition making such circuits incompatible with systems (such as those embodying complementary structures) in which it is desired to substantially eliminate quiescent power dissipation.

Circuits embodying the invention include a storage element having first and second terminals for the application therebetween of an operating potential and an input point to which binary information may be applied. The circuit also includes gating means connected between an input line and said input point. The operating potential to the storage element is supplied via an impedance element connected between a point of operating potential and said first terminal. Means for writing information into the element includes a switching means connected between said first terminal and said input line for drawing current through the impedance element and decreasing the operating potential across the element when a given bit of information is being written into the element.

Figure 2:
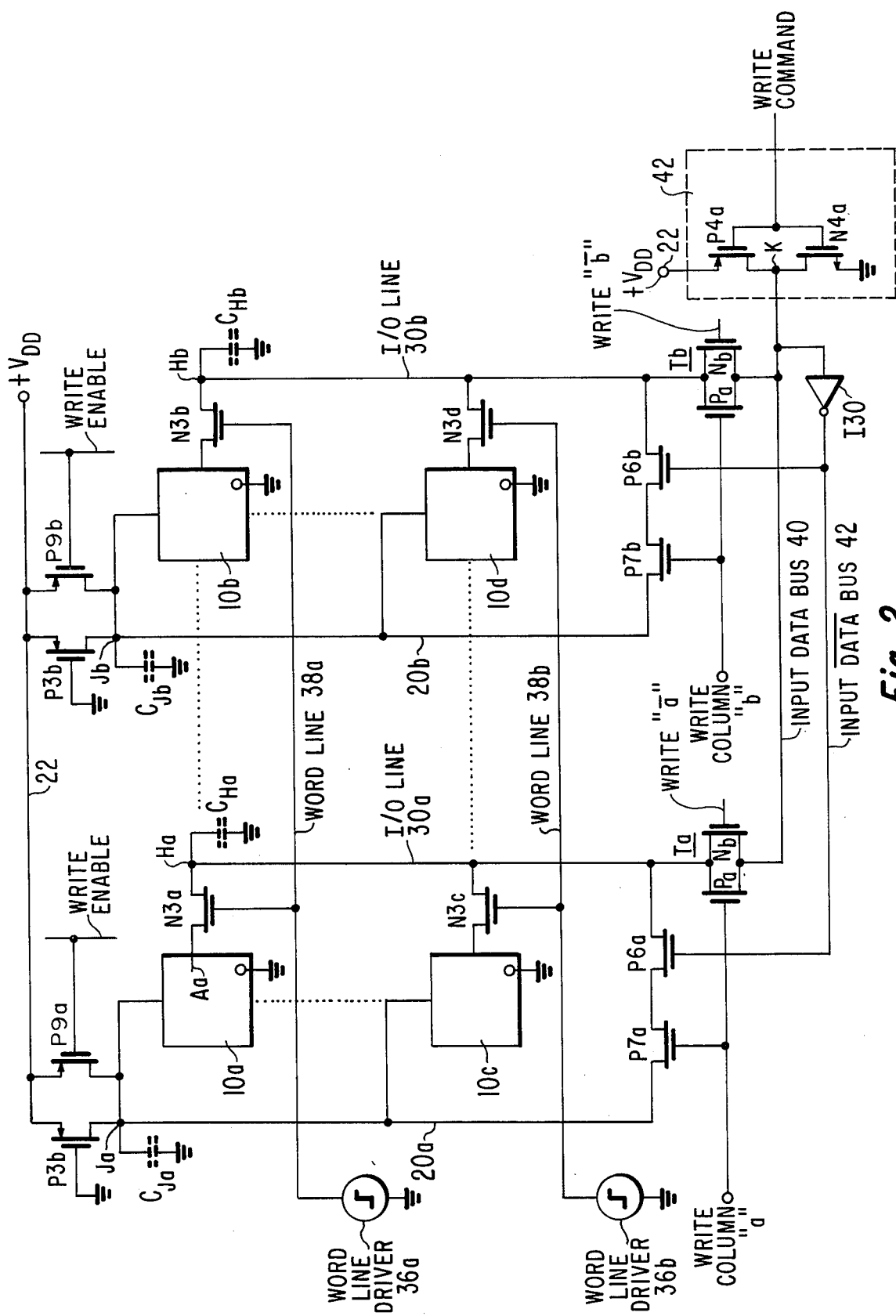

In the accompanying drawing, like reference characters denote like components; and FIG. 1 is a partial schematic partial block diagram of a portion of a memory array embodying the invention; and FIG. 2 is another partial schematic partial block diagram of a portion of a memory array embodying the invention.

The active devices which are preferred for use in practicing the invention are IGFETS. For this reason, the circuit is illustrated in the drawing as employing such transistors and will be so described hereinafter. However, this is not intended to preclude the use of other suitable devices and to this end, the term "transistor", when used without limitation in the appended claims, is used in a generic sense.

In the FIGURES, transistors of P-conductivity type are identified by the letter P followed by a particular reference numeral and transistors of N-conductivity type are identified by the letter N followed by a particular reference numeral.

In FIG. 1, the "flip-flop" 10 is shown as comprising two cross-coupled inverters $I_1$ and $I_2$. Inverter $I_1$ includes transistors P1 and N1 and inverter $I_2$ includes transistors P2 and N2. The sources of transistors N1 and N2 are connected to a point of reference potential, indicated as circuit ground, and the sources of transistors P1 and P2 are connected to line 20 which is the positive voltage supply line for the flip-flop.

The drains of transistors P1 and N1 are connected to each other and to the gates of transistors P2 and N2. In a similar manner, the drains of transistors P2 and N2 are connected to each other and to the gates of transistors P1 and N1.

To make the flip-flop difficult to be inadvertently altered, transistors P2 and N2 in inverter $I_2$ are, preferably, selected to have lower impedance conduction channels than transistors P1 and N1 for the same value of forward source-to-gate bias. That is, the impedance of the conduction channel of transistor N2 is lower than the impedance of the conduction channel in transistor N1 when the gates of these transistors are each at +V volts. Correspondingly, the impedance of the conduction path of transistor P2 is lower than that of transistor P1, when the gates of these transistors are at ground potential.

Node A, common to the drains of transistors P2 and N2 serves as the common input-output point of the flip-flop 10. Node B is common to the drains of transistors P1 and N1 and the gates of transistors P2 and N2.

The means for supplying an operating potential to the flip-flop includes a transistor P3, operated in the common source mode, connected at its source to terminal 22, at its gate to ground potential and at its drain to line 20 at node J. A fixed positive operating potential of $+V_{DD}$ volts (from a source not shown) is applied to terminal 22. Transistor P3 functions like, and could be replaced by, a resistive impedance element. It couples the supply voltage to the cell and enables current to flow to the cell via its conduction path.

Flip-flop 10 is bistable and, in either steady state, draws no appreciable current, whereby very little current is drawn through transistor P3 and the potential on line 20 is at, or close to, $+V_{DD}$ volts.

When transistors N1 and P1 have +V volts applied at their gates transistor N1 is turned on and transistor P1 is turned off. The voltage at node B then is zero volts and little current flows through the conduction path of transistor P1. The zero volts is applied at the gates of transistor P1. The zero volts is applied at the gates of transistors N2 and P2, turning off transistor N2 and turning on transistor P2. The voltage at node A then is approximately +V volts, which voltage maintains transistors N1 and P1 in the state indicated above. The memory cell may then be considered to be storing a binary "1" bit under these conditions.

In the other stable state, transistors N1 and P2 are turned off and transistors N2 and P1 are turned on. The voltage at node B then is +V volts, and the voltage at node A is at ground potential. The memory cell may then be considered to be storing a binary "0" bit.

A gating transistor N3 has its conduction path connected between node A and input (bit) line 30. For ease of writing into the cell, transistor N3 is preferably selected to have a lower impedance conduction path than transistors P2 or N2 for the same value of forward gate-to-source bias. When transistor N3 is turned on, flip-flop 10 is closely coupled to line 30. Information on line 30 can then be written into the flip-flop, or the state of the flip-flop can be read out (sensed) on line 30. When transistor N3 is turned off flip-flop 10 may be considered to be electrically disconnected and isolated from line 30.

A tri-state write driver circuit 32, which may be any one of a number of known tri-state circuits, is connected to line 30. Circuit 32 includes a control circuit 33 which in response to write command signals controls the conductivity of transistors P4 and N4, which comprise the output stage of circuit 32. Transistors P4 and N4 are connected at their drains to node H which is common to line 30 with transistor P4 connected at its source to line 20 at node J and transistor N6 connected at its source to ground potential. The impedance of the conduction path of transistor P4 or transistor N4 may be in the same range as that of transistor N3 for the same value of forward gate-to-source bias. In response to a write "1" command (not shown) transistor P4 is turned on (transistor N4 is turned off) and connects line 30 through its low "on" impedance to node J. In response to a write "0" command (not shown) transistor N4 is turned on (transistor P4 is turned off) and connects line 30 to ground through its low "on" impedance. During a read cycle, or in the absence of a write command, transistors P4 and N4 are both turned off.

The gate electrode of transistor N3 is connected to a word line 38, which line is common to all of the memory cells of the same word in a word organized memory. By the same token, the line 30 is common to all of the bits of like significance in the several words. The word line 38 is connected to and driven by line driver circuit 36 which when it supplies a positive level of $+V_{DD}$ volts amplitude turns on transistor N3 and which, when it supplies a level of zero volts turns off transistor N3. In the discussion of the operation of the circuit to follow it is assumed that the turn on signal applied to the gate of transistor N3 is equal to $+V_{DD}$ volts.

The capacitance associated with line 20 and node J is represented by capacitance $C_J$ connected between node J and ground. The capacitance associated with line 30 and node H is represented by capacitance $C_H$ connected between node H and ground.

When information is to be written into the flip-flop, transistor N3 is first turned on (as are the other gating transistors whose control electrodes are connected to word line 38) and transistors P4 and N4 are turned off. The contents of the cell are then effectively read-out onto line 30 which is then charged via the conduction path of transistor N3 to a voltage level corresponding to that present at node A. When node A is at, or close to, zero volts (a "0" is being stored in the cell) transistor N3, when turned on, conducts in the common source mode and discharges capacitor $C_H$ and line 30 to ground via transistor N2. When node A is at or close to $+V_{DD}$ volts (a "1" is being stored in the cell) transistor N3, when turned on, conducts in the source follower mode and in series with transistor P2 charges line 30 and capacitor $C_H$ towards $[+V_{DD} - V_T]$ volts.

Since in the static condition flip-flop 10 draws very little current, node J and line 20 are charged to substantially $+V_{DD}$ volts.

The operation of the circuit will first be explained for a write "1" condition when a "0" is stored in the flip-flop since in this write condition transistor N3 operates in the source follower mode and it is this write condition which is the most difficult to effectuate.

When a write "1" command is supplied to circuit 33, transistor P4 is turned on and transistor N4 is turned off. Following the turn on of transistor P4 there is a transient period until the flip-flop changes state. As soon as transistor P4 is turned on, the charge on $C_J$ is coupled and distributed via the conduction path of transistor P4 to $C_H$. If $C_H$ is approximately equal to $C_J$, the potential at node J and line 20 ($V_J$) will drop from $V_{DD}$ volts to almost one half $V_{DD}$ and the potential at node H and line 30 ($V_H$) will rise from approximately zero volts to almost one half $V_{DD}$. Thus, as soon as transistor P4 is turned on the cell supply voltage $V_J$ drops considerably.

Also, as soon as transistor P4 is turned on, current flows through the conduction paths of transistors P3, P4, N3, and N2 which are connected in series between $+V_{DD}$ volts and ground. The operating potential gets divided across their conduction paths (source-to-drain) in proportion to their effective impedances.

In a typical circuit the impedances (Z) of the conduction paths of transistors N2, N3, P3 and P4 for the same value of gate-to-source forward bias, were made as follows.

The Z of transistor N2 was made 4 times that of transistor N3, while the Z of transistor P3 was made 8 times that of transistor N3 and the Z of transistor P4 was made 1⅓ times that of transistor N3. For this or similar ratio of impedances it is clear that there is a large voltage drop across transistor P3 when transistors P3, P4, N3 and N2 are turned on and conducting. Consequently, the cell voltage $V_J$, is decreased considerably.

Decreasing the cell voltage is extremely important since it decreases the forward bias to transistor N2 thereby reducing the current flow to ground. This allows transistor N3, although operating in the source follower mode, to drive node A positively and to flip the cell as further described below.

A transistor operated in the source follower mode stops conducting (appears like an extremely high impedance) when its gate-to-source potential ($V_{GS}$) becomes equal to $V_T$ volts. But, even before the transistor stops conducting completely, its conductivity decreases as its $V_{GS}$ decreases. Thus, a source follower transistor when used to charge up a node or line does not function as a low source impedance driver when it must supply a large current, and its source potential approaches within $V_T$ volts of its gate voltage. In the circuit of FIG. 1, gating transistor N3 is operated in the source follower mode when writing a "1" into a flip-flop storing a "0". But, although transistor N3 is operated in the source follower mode, its gate is at $V_{DD}$ volts while its drain potential, $V_H$, is considerably less than $V_{DD}$, ($V_H$ will be less than $V_J$ by the amount of the voltage drop across transistor P4). Therefore, transistor N3 is overdriven and can couple the potential applied at its drain to its source with very little offset. By effectively overdriving the gate of transistor N3, the problem of voltage offset has been eliminated during the critical portion of the write "1" cycle. The voltage offset has been decreased by making the drain to source voltage that transistor N3 must pass much lower than its gate voltage and by concurrently reducing the current flowing through N3.

This feature is extremely important and is best appreciated by comparison to the prior art.

It may be shown that applying a considerably decreased value of $V_{DD}$ to the drain of transistor N3 does not adversely affect the value of the potential passed by it to node A. Assume $V_{DD}$ to be 5 volts, the threshold voltage ($V_T$) of transistor N3 to be 1.5 volts, and, as in the prior art, that transistor P3 is short circuited. The maximum potential that could be applied by node A by means of transistor N3 would be 3.5 volts. But, due to the loading of transistor N2 which has five volts applied to its gate, the actual value of the potential applied to node A might be as low as 1.5 volts. Thus, transistor P1 with 5 volts on its source and 1.5 volts at its gate would still be conducting, biasing transistor N2 on, and the flip-flop could not be set to the "1" state.

Referring back to the circuit of FIG. 1, with transistor P3 in the circuit, assume again that $V_{DD}$ is 5 volts, that the gate of transistor N3 is at 5 volts, and that the potential $V_H$ at the drain of transistor N3 is approximately 3 volts. Since the cell potential $V_J$ is also approximately 3 volts, the potential applied to the gate of transistors N2 is at most equal to 3 volts. This decreases the forward bias applied to the gate of transistor N2 and the amount of current that it can sink. This increases the impedance of the load (N2) at the source of transistor N3. Consequently, transistor N3 with its gate at 5 volts and its drain at 3 volts can couple at least 2 volts to node A. For this example the value of signal applied to node A is increased over that of the prior art, despite a lower voltage at node H. The net effect of adding P3 has been to drastically reduce the operating potential ($V_J$) to the cell while also increasing th- value of the signal ($V_A$) coupled into the flip flop. Thus, transistor P1 with approximately 3 volts applied to its gate and 2 volts to its source can be easily cut off. As a result the flip-flop is weakened and information can be written into it easily.

Concurrent with the above, as the potential at node A rises, transistor P1 is being turned off which decreases the drive into node B and the forward bias supplied to transistor N2. Simultaneously, transistor N1 is being turned on causing transistor P2 to begin to be turned on causing a further increase in potential at node A. This regenerative process continues until transistors N1 and P2 are turned on and transistors P1 and N2 are turned off. At that point the flip-flop no longer draws any current to ground. Current continues to flow through transistors P3 and P4 into nodes H and J and through transistor P2 into node A charging the nodes to $+V_{DD}$ volts. Once the nodes are recharged there is no further current flow or power dissipation associated with the write "1" cycle.

In brief when transistor P4 is turned on the following occur:

(1) Charge is redistributed between $C_J$ and $C_H$ causing the operating potential ($V_J$) applied to the memory cell to drop rapidly;

(2) Current flows through transistor P3 maintaining $V_J$ at approximately ½ $V_{DD}$ and $V_H$ very close to that value;

(3) Transistor N3, operated in the source follower mode, is overdriven so the potential $V_H$ is applied to node A with little offset; and (4) Since the operating potential ($V_J$) applied to the cell is reduced, the conductivity of the transistors forming the flip-flop is reduced making it easier to write the "1" state into the cell.

The operation of the circuit will now be discussed for a write "0" command when a "1" is stored in the flip-flop. When a "0" is to be written into the cell, transistor N4 is turned on and transistor P4 is turned off.

Prior to the turn on of transistor N4, node A was "high" and transistor N3 had been turned on charging line 30 and node H to $V_{DD} - V_T$ volts. When transistor N4 is subsequently turned on it conducts in the common source mode and discharges node H to ground potential. Transistor N3 then also conducts in the common source mode and node A is clamped via the low impedance conduction paths of transistors N3 and N4 to ground.

During the initial portion of the transition, transistors P3, P2, N3 and N4 are turned on and provide a series path between $+V_{DD}$ and ground. Transistors P1 and N2 are turned off. Since transistors N3 and N4, typically, have a lower impedance conduction path then transistors P3 and P2 the potential at node A can be lowered well below one half $V_{DD}$. This decreases the forward bias being applied to the gate of transistor N1 which decreases its conduction and which in turn decreased the forward bias applied to the gate of transistor P2. As P2 conducts less, the potential at node A decreases further. The clamping action of transistors N3 and N4 thus quickly turns off transistors N1 and P2 and turns on transistors P1 and N2.

During the transitional state current flows through transistor P3 lowering the voltage applied to the cell. When the cell flips and the zero is written into the flip-flop current is no longer drawn through transistor P3 via the flip flop transistors. The cell supply voltage on line 20 then recharges towards $+V_{DD}$ volts. Therefore, this circuit although intended mainly to enhance the write 1 condition, also enhances the write 0 operation.

If the gating transistors were of P conductivity type it would operate in the source follower mode when writing a zero and this write condition would pose a problem. The circuit of FIG. 1 would then be modified as follows. The source electrodes of the flip-flop transistors of N conductivity type would be connected to ground via an impedance element or via the conduction path of a forward-biased transistor of N-conductivity type. The source electrodes of the P-transistors of the flip-flop could be directly connected to terminal 22. The P transistor of the write driver circuit would be connected between $V_{DD}$ (terminal 22) and line 30 and the N transistor of the write driver circuit would be connected between line 30 and the end of the impedance element common to the sources of the N-transistors of the flip-flop. The operation of the circuit for the write "0" condition would then be analogous to the write "1" condition described above and the write "1" condition would be analogous to the write "0" condition.

In the circuit of FIG. 1 the cell operating voltage is automatically decreased when information is being written into the cell and is automatically restored when the desired information is written into cell.

During read out of the cell contents, current is drawn through transistor P3 until the bit line 30 is charged. This causes a dip in the cell supply voltage. This may be substantially eliminated by placing a low impedance transistor (such as transistor P9 in FIG. 2) in parallel with transistor P3 which would be turned on during the read cycle and turned off during the write cycle.

In the circuit of FIG. 1 the operating voltage to the cell being written as well as the voltage to the writing circuit is decreased during the write cycle. The circuit of FIG. 2 illustrates an arrangement in which the voltage to a cell being written is decreased without a like decrease to the writing circuit. FIG. 2 shows the "write" portion of a memory array which is bit organized during the write cycle.

FIG. 2 shows two rows and two columns of an array and four cells, similar to those of FIG. 1, connected at the intersections of the rows and columns. Associated with each column is an I/O line, 30a, 30b; a cell voltage supply line 20a, 20b; a high impedance element P3a, P3b; a low impedance switched transistor P9a, P9b; two transistors, P6a and P7a, P6b and P7b, connected between each I/O line 30a, 30b and cell voltage supply line 20a, 20b; and a transmission gate Ta, Tb connected between each I/O line and an Input Data Bus 40.

The Input Data Bus is connected to the output K of an inverting circuit 42. The output K of the inverting circuit is coupled via inverter I30 to INPUT $\overline{\text{DATA}}$ BUS 42. This bus applies the $\overline{\text{DATA}}$ signal to the gates of transistors P6a, P6b. In addition a column select write "a" or "b" signal is applied to the gates of transistors P7a or P7b and to the transmission gates Ta, Tb. The write "a" or "b" selects the column to which input information to be written is applied. Each row is driven by a different word line 38a, 38b, the word lines being energized at different times by word line drivers 36a, 36b.

The main differences between the circuit of FIG. 2 and that of FIG. 1 are: (a) the addition of a transistor (P9a, P9b) in parallel with the impedance element transistor (P3a, P3b); (b) the connection of two transistors (P6a and P7a or P6b and P7b) between a cell voltage supply line (20a, 20b) and an I/O line (30a, 30b); and (c) the connection of a transmission gate (Ta, Tb) between each I/O line and input data bus 40.

The transmission gates Ta, Tb, enable the Tri-State output to be multiplexed onto the I/O lines 30a, 30b. The use of the transmission gates enables the replacement of the Tri-State circuit 32 of FIG. 1 with a simpler inverting circuit Therefore a single inverting circuit can be used for the whole memory array resulting in a reduction in the total number of devices required. Most importantly, it reduces the write circuitry that must be placed on pitch with each column of the memory cell array.

Transistors P9a, P9b are low impedance devices which are normally on except during a write cycle. During a write cycle a positive going Write Enable Pulse is applied to the gates of transistors P9a, P9b turning them off. Transistors P9b, P9a can quickly charge up lines 20a, 20b when turned on. With transistors P9a and P9b in the circuit, and for other reasons discussed below, the impedance of the conduction path of transistors P3a, P3b can be made much larger than that of transistors P3 in FIG. 1. Making the impedance of transistors P3a, P3b large makes the operation of the circuit of FIG. 2 different from that discussed in FIG. 1 in some respects discussed below.

The operation of the write enhancement circuitry may be best understood by illustrating, for example, the writing of a "1" into cell 10a storing a "0". Assume, initially that word line 38 is at $+V_{DD}$ volts, that I/O line 30 is charged to the zero volt level stored in cell 10a, and that line 20 and $C_{Ja}$ are charged to $+V_{DD}$ volts. First, the Write Enable signal goes to $+V_{DD}$ volts and transistor P9a is turned off. Concurrently therewith, a write "a" select pulse of 0 volt is applied to the gate of transistor P7a turning it on and also enabling transmission gate Ta. A write "1" command is applied to circuit 32 turning on transistor P4 producing a signal of $+V$ volts on DATA BUS 40 and a 0 volt level on the $\overline{\text{DATA}}$ BUS 42 turning on transistor P6a. With transistors P6a and P7a turned on, lines 20a and 30a are coupled to each other via the conduction paths of P6a, P7a and the charge on capacitance $C_{Ja}$ is redistributed between $C_{Ja}$ and $C_{Ha}$. Assuming these two capacitances to be equal, the potential on line 20a drops to approximately $\frac{1}{2} V_{DD}$ and that on line 30 rises to approximately $\frac{1}{2} V_{DD}$. But, since transistor P3a is a very large impedance device only a small current can flow through the conduction paths of transistors P3a, P7a, P6a, N3a and the flip-flop transistor N2 to ground. This current is normally insufficient to flip the cell. However, in this circuit the source of transistor P4a is directly connected to $V_{DD}$ and can supply sufficient current and voltage through transmission gate Ta (whose devices are made to have low impedances) onto line 30a and through transistor N3 to node Aa to set flip-flop 10a to the high state.

In the circuit of FIG. 2, transistor P6a is turned on only when the data to be written into the cell is a "b". If a "0" is to be written the $\overline{\text{DATA}}$ BUS 42 is driven to +V volts and transistor P6a or P6b is turned off. A "0" is written into the cell by the clamping action of transistor N3a, transmission gate Ta and transistor N4a. These transistors clamp the input Aa close to ground potential causing the flip-flop to go to the low state. As for the circuit of FIG. 1, current flows only during the transitional period when the flip-flop is being driven to the state other than the one it is storing. As soon as the flip-flop is set to the data condition being written current ceases to flow through the flip-flop and line 20a will automatically return to $+V_{DD}$.

In the circuit of FIG. 2, the cell voltage is decreased when a "high level" is to be written into the cell but the operating potential to the write circuitry applying a high level to the input of the cell is not decreased. For a Write "1" condition one portion of the circuit comprising transistors P3a, P6a and P7a is used to lower the potential at node J and to supply some write signal to the I/O line. But, the prime write signal input to the I/O line is obtained from the data input bus which is driven hard towards $+V_{DD}$.

The storage element has been illustrated using a flip-flop but, clearly, any bistable element may be used: (a) whose conductivity is dependent on the operating potential applied to it; (b) having an input point to which data to be stored may be applied; and (c) which has some internal conduction path between its input point and a terminal to which an operating or reference potential for the element is applied.

The circuits of the invention make use of the internal conduction path of the storage element to provide a conduction path for the impedance element current to flow and to lower the cell operating voltage. This is highly significant since as soon as the storage element changes state to the value being written into the cell the path is effectively opened and substantially no current flows through the storage element and after the recharging of the capacitive nodes of the circuit no current flows through the impedance element.

What is claimed is:

1. The combination comprising:
   two inverters, each inverter having an input and an output and first and second terminals for the application therebetween of an operating potential;
   means cross coupling the two inverters for forming a flip-flop;
   a data input line;
   a gating transistor connected between said data input line and a point common to the input of one inverter and the output of the other inverter;
   a voltage supply terminal for the application thereto of an operating voltage;
   an impedance element connected between said supply voltage terminal and said first terminals of said inverters providing a continuous conduction path therebetween when information is to be written into said flip-flop;
   means for applying a reference potential to said second terminals of said inverters; and
   selectively enabled writing means connected between said first terminals of said inverters and said input data line for, when enabled, passing a current between said voltage terminal and said data line via said impedance element and said writing means thereby producing a potential drop across said impedance element which decreases the operating potential between said first and second terminals while simultaneously providing information of one binary significance to be written into said flip-flop onto said data input line.

2. The combination as claimed in claim 1 wherein said writing means includes a first write transistor having its conduction path connected between said first terminals and said input data line; and further including a second write transistor having its conduction path connected between said second terminals of said inverters and said input data line.

3. The combination as claimed in claim 2 wherein said point common to the input of one inverter and the output of the other inverter is the sole input-output point to said flip-flop, and wherein there is solely one gating transistor per flip-flop having its conduction path connected between said sole input-output point and said data input line.

4. The combination as claimed in claim 2 wherein said flip-flop exhibits a low impedance between said first terminals and said common point when in one state, a low impedance between said common point and said second terminals when in its second state, and a high impedance between said first and second terminals under static conditions.

5. The combination as claimed in claim 4 wherein said gating transistor has its conduction path connected between said common point and said data input line; and
   means for applying a turn on signal to the control electrode of said gating transistor having an amplitude approximately equal to the voltage applied to said voltage supply terminal.

6. The combination as claimed in claim 4 wherein said impedance element includes a single transistor having its conduction path connected between said voltage supply terminal and said first terminals and means for biasing said single transistor into conduction.

7. The combination as claimed in claim 6 wherein said gating transistor and said second write transistors are of one conductivity type and wherein said impedance element transistor and said first write transistor are of second different conductivity type.

8. The combination as claimed in claim 7 wherein each one of said inverters includes first and second transistors of complementary conductivity type.

9. The combination as claimed in claim 8 wherein the impedance of the conduction path of said impedance element is greater than the impedance of the conduction path of either one of said first and second write transistors or of said gating transistors for the same value of forward bias.

10. The combination as claimed in claim 9 wherein said transistors are insulated-gate field-effect transistors.

11. The combination comprising:
    a storage element having first and second terminals for the application therebetween of an operating potential and having an input point adapted to receive binary information to be stored in said element and said element exhibiting a relatively low impedance between said input point and one of said first and second terminals for one binary condition;

a data input line;

a gating transistor connected between said data input line and said input point;

a voltage supply terminal for the application thereto of a fixed operating voltage;

an impedance element connected between said supply voltage terminal and said first terminal providing a continuous conduction path therebetween;

means for applying a reference potential to said second terminal; and selectively enabled writing means connected between said first terminal and said data input line for providing a conduction path between said voltage supply terminal and said data input line via said impedance means and said writing means thereby causing a decrease in the potential at said first terminal, when enabled.

12. The combination as claimed in claim 11 wherein said storage element is a flip flop comprised of two inverters, each inverter having an input and an output and first and second power terminals for the application therebetween of an operating potential;

wherein said first power terminals of said inverters are connected to said first terminal;

wherein said second power terminals of said inverters are connected to said second terminal; and wherein the input of one of said two inverters and the output of the other one of said two inverters are connected to said input point.

13. The combination as claimed in claim 12 wherein said impedance element is a transistor having a control electrode and a relatively high impedance conduction path; said conduction path being connected between said voltage supply terminal and said first terminal; and said control electrode being connected to a point of fixed potential for maintaining said impedance element transistor in conduction.

14. The combination as claimed in claim 13 wherein said writing means includes selectively enabled switching means connected between said first terminal and said data input line for decreasing the potential at said first terminal and simultaneously coupling a data input signal of one binary significance to said data input line, when enabled.

15. The combination as claimed in claim 14 wherein said selectively enabled switching means includes first and second transistors having their conduction paths connected in series between said data input line and said first terminal, wherein said first transistor is turned on when information is to be written into said flip flop;

wherein said second transistor is enabled when the binary bit to be written into said flip flop has a value causing said gating transistor to conduct in the follower mode; and wherein said means for selectively coupling a data input signal to said data input line includes a circuit for producing binary signals and means for coupling these binary signals to said data input line.

16. In combination:

a matrix array of storage cells arranged in rows and columns, each cell having first and second terminals for the application therebetween of an operating potential and an input point for the application thereto of data to be stored;

a column conductor per column adapted to receive data to be written into the cells of the column;

a gating transistor per cell of a column having its conduction path connected between the input point of the cell and the column conductor for that column;

a row conductor per row;

means connecting the control electrode of the gating transistors of a row of cells to the row conductor for that row;

a cell voltage supply line per column connected to the first terminals of the cells of a column;

a voltage supply terminal for the application thereto of an operating potential for the cells;

an impedance element per column connected between said voltage supply terminal and said cell voltage supply line providing a continuous conduction path therebetween;

means for applying a reference potential to the second terminals of said cells; and means for writing information into selected cells including selectively enabled coupling means connected between said cell voltage supply line and the column conductor for each column for decreasing the operating potential to the cells of a column while information is being written into a cell of that column, said selectively enabled coupling means providing a conduction path via said impedance element between said voltage supply terminal and said column conductor.

17. The combination as claimed in claim 16 further including means for turning on said selectively enabled coupling means when writing one binary condition into a cell and further including means for supplying a signal corresponding to that one binary condition onto said column conductor.

* * * * *

UNITED STATES PATENT OFFICE
CERTIFICATE OF CORRECTION

PATENT NO. : 4,075,690

DATED : February 21, 1978

INVENTOR(S) : Joel Roy Oberman et al

It is certified that error appears in the above-identified patent and that said Letters Patent are hereby corrected as shown below:

Column 1, line 67 "transverse" should be --- transistors ---.

Column 9, line 6 change "b" to ---"1"---.

Signed and Sealed this

Fifteenth Day of August 1978

[SEAL]

Attest:

RUTH C. MASON
*Attesting Officer*

DONALD W. BANNER
*Commissioner of Patents and Trademarks*